United States Patent [19]
Shin et al.

[11] Patent Number: 5,703,532
[45] Date of Patent: Dec. 30, 1997

[54] FULLY DIFFERENTIAL SELF-BIASED SIGNAL RECEIVER

[75] Inventors: Hyun Jong Shin, Ridgefield, Conn.; Peter Hong Xiao, Mohegan Lake, N.Y.

[73] Assignee: International Business Machines Corporation, Armonk, N.Y.

[21] Appl. No.: 588,218

[22] Filed: Jan. 18, 1996

Related U.S. Application Data

[60] Provisional application No. 60/008,583 Dec. 13, 1995.

[51] Int. Cl.$^6$ .................................................. H03F 3/45
[52] U.S. Cl. ........................... 330/253; 330/255; 330/258; 330/261; 330/311
[58] Field of Search .................................. 330/253, 255, 330/258, 261, 264, 311

[56] References Cited

U.S. PATENT DOCUMENTS

| | | |
|---|---|---|
| 4,937,476 | 6/1990 | Bazes . |
| 4,958,133 | 9/1990 | Bazes . |
| 5,006,817 | 4/1991 | Babanezhad ...................... 330/258 X |
| 5,381,112 | 1/1995 | Rybicki et al. ...................... 330/258 X |

OTHER PUBLICATIONS

Cordaro, "Complementary FET Differential Amplifier", *IBM Technical Disclosure Bulletin*, vol. 16, No. 10, Mar. 1974 pp. 3227, 3228.

B. A. Chapell, et al., "Fast CMOS ECL Rceiver With Worst–Case Sensitivity," IEEE J. Solid State Circuits, vol. 23, No. 1, Feb. 1988.

M. Bazes, "Two Novel Fully Complementary Self–Biased CMOS Differential Amplifiers," IEEE of J. of Solid State Circuits, vol. 26, No. 2, Feb. 1991.

*Primary Examiner*—James B. Mullins
*Attorney, Agent, or Firm*—Robert P. Tassinari, Jr.; Louis P. Herzberg

[57] ABSTRACT

A self-biased, fully differential, complementary receiver apparatus and method is presented. The receiver accepts differential inputs that can vary over the full rail-to-rail common mode voltage range. It produces double-ended complementary outputs swinging rail-to-rail useful in signal level conversion and comparator applications. The receiver includes a dual, fully complementary and mirror-symmetrical arrangement of a differential input stage, a biasing stage and an output stage. A self biasing voltage is generated with a balanced voltage divider coupled between the outputs of the biasing stages. This frees both biasing outputs for use as analogous but complementary receiver outputs while providing the receiver with all the advantages of self bias. For small signal differential inputs, the input and biasing stages operate in their linear region useful for amplifier applications. Whereas the circuit is most advantageously implemented using both p-type and n-type CMOS transistors, it can similarly be advantageously implemented with bipolar transistors. Alternate circuit configurations are described.

35 Claims, 6 Drawing Sheets

FULLY DIFFERENTIAL SELF-BIASED SIGNAL RECEIVER

CROSS-REFERENCE TO RELATED APPLICATIONS

The present application claims priority to co-pending U.S. Provisional Application 60/008,583 filed Dec. 13, 1995.

FIELD OF THE INVENTION

The present invention is directed to the field of electronic circuits. It is more specifically directed to signal level conversion circuitry as particularly related to integrated circuits.

BACKGROUND OF THE INVENTION

It is a constant endeavor to find improved circuits to perform signal level conversion from a first set of signal level parameters to a second set of signal level parameters. This is particularly the case in digital signal logic and transmission circuits in which it is often necessary to convert signals from one set of levels to another set of levels. Examples of this are the shifting of signals between TTL levels and CMOS levels, ECL and CMOS levels, and from the more recently defined LVDS differential signal formats to and from CMOS levels. These conversions often call for high bandwidth reliable CMOS amplifiers.

It has been shown that self-biased CMOS devices work especially well in signal conversion applications because of their robustness. These are known to be substantially immune to temperature, process and supply voltage. Currently, most of the self-biased devices are single-ended input and single-ended output amplifiers. Others have differential input and singled-ended outputs. None have fully differential inputs and outputs.

SUMMARY OF THE INVENTION

In contrast to all the above it is an object of the present invention to provide a CMOS circuit receiver that is fully differential, double-ended and self-biased, and is capable of swinging rail-to-rail. The term 'swinging from rail-to-rail' as used herein refers to a signal swinging substantially between the first rail and the second rail voltages. It is fully differential in that it accepts a pair of differential inputs and produces a pair of complementary differential outputs. This type of circuit will henceforth be referred to as an FDSR circuit device. It is a further object of the present invention for the FDSR device to accept up to a full rail-to-rail single ended or differential inputs and produce full rail-to-rail differential outputs.

It is another object of the invention to provide a fully complementary FDSR circuit device.

It is a further object of the present invention to provide a fully differential, double-ended, self-biased amplifier circuit having two differential inputs and produces two complementary outputs. In a particular implementation it is desirable that the outputs swing between the supply voltage rails.

It is also a further object of the present invention that in a digital utilization one output is in a first state with the other output in a second state, when the first input is in one voltage relationship with the second input, and the outputs exchange states when the first input goes to an opposite voltage relation with respect to the second input. Preferably, in the first relationship the outputs are on opposite sides of the power supply rail, and in the second state the outputs exchange rail sides from that of the first state.

In one embodiment of the invention a method is provided for producing and using a self-bias voltage to bias inputs of a local complementary circuit which has dual complementary biasing stages and complementary outputs. The method includes the steps of: coupling a bias circuit between the outputs of the biasing stages which producing a self bias voltage; coupling the self bias voltage to the bias inputs.

It is also a further object of the present invention to provide a device producing and using a self-bias voltage to bias the inputs of a local complementary circuit. The circuit has dual complementary biasing stages and complementary outputs. The device comprises: a bias circuit coupled between the biasing outputs of the biasing stages and producing the self-bias voltage; means for coupling the self-bias voltage to the bias inputs;

In one embodiment the bias circuit includes a voltage divider comprising a first and second resistor connected in series. A junction between first and second resistor produces the bias voltage. The resistance of the first resistor is substantially equal to the resistance of the second resistor.

In one embodiment of the present invention, an amplifier circuit comprises a first transistor having its source coupled to a first voltage terminal, its drain coupled to a first node and its gate coupled to a biasing node; a second transistor having its source coupled to a second voltage terminal and its drain coupled to a second node and its gate coupled to the biasing node; a third transistor having its source coupled to the first node and its drain coupled to a third node and its gate coupled to accept a first input signal; a fourth transistor having its source coupled to the second node, its drain coupled to a fourth node and its gate coupled to accept the first input signal; a fifth transistor having its source coupled to the first voltage terminal, its drain coupled to the fourth node and its gate coupled to the biasing node; a sixth transistor having its source coupled to the fourth node and its drain coupled to a fifth node and its gate coupled to the biasing node, the fifth node being a first amplifier output having a first signal output proportional to the difference between the first input signal and second input signal; a seventh transistor having its source coupled to the third node, its drain coupled to the fifth node and its gate coupled to the biasing node; an eighth transistor having its source coupled to the second voltage terminal, its drain coupled to the third node and its gate coupled to the biasing node; a ninth transistor having its source coupled to the first node, its drain coupled to a sixth node and its gate coupled to accept a second input signal; a tenth transistor having its source coupled to the second node, its drain coupled to a seventh node and its gate coupled to accept the second input signal; an eleventh transistor having its source coupled to the first voltage terminal and its drain coupled to the seventh node and its gate coupled to the biasing node; a twelfth transistor having its source coupled to the seventh node, its drain coupled to an eighth node and its gate coupled to the biasing node, the eighth node being a second amplifier output having a second signal output proportional to the difference between the first input signal and the second input signal and being complementary to the first amplifier output; a thirteenth transistor having its source coupled to the sixth node, its drain coupled to the eighth node and its gate coupled to the biasing node; a fourteenth transistor having its source coupled to the second voltage terminal and its drain coupled to the sixth node and its gate coupled to the biasing node; a first resistor coupled between the fifth node and the biasing node; a second resistor coupled between the eighth node and the biasing node, the first and second resistors forming a negative bias feedback circuit feeding the biasing node.

In one embodiment of the invention the resistance of the first resistor is substantially equal to the resistance of the second resistor.

In one embodiment of the invention the first voltage terminal is at ground potential.

In one embodiment of the present invention the first, third, fifth, sixth, ninth, eleventh and twelfth transistors be n-type CMOS transistors and second, fourth, seventh, eighth, tenth, thirteenth and fourteenth transistors be p-type CMOS transistors.

In one embodiment of the invention, the amplifier includes a first invertor comprising a fifteenth transistor having its source coupled to the first voltage terminal, its drain coupled to a tenth node and its gate coupled to the fifth node; a sixteenth transistor having its source coupled to the second voltage terminal, its drain coupled to a tenth node and its gate coupled to the fifth node; and a third resistor coupled between the fifth node and the tenth node, the tenth node being a first invertor output, the first invertor converting current from the first amplifier output into a voltage signal; and a second invertor comprising: a seventeenth transistor having its source coupled to the first voltage terminal, its drain coupled to an eleventh node and its gate coupled to the eighth node; an eighteenth transistor having its source coupled to the second voltage terminal, its drain coupled to the eleventh node and its gate coupled to the eighth node; a fourth resistor coupled between the eighth node and the eleventh node, the eleventh node being a second receiver output, the second invertor converting current from the second amplifier output into a voltage signal.

In one embodiment of the present invention, the amplifier further includes a third invertor comprising a nineteenth transistor having its source coupled to the first voltage terminal, its drain coupled to a twelfth node and its gate coupled to the tenth node; a twentieth transistor having its source coupled to the second voltage terminal, its drain coupled to the twelfth node and its gate coupled to the tenth node. The twelfth node is the first enhanced receiver's output. The third invertor amplifies the first receiver output. The amplifier also includes a fourth complementary invertor made-up with a twenty-first transistor with its source coupled to the first voltage terminal, its drain coupled to a thirteenth node and its gate coupled to the eleventh node, and a twenty-second transistor having its source coupled to the second voltage terminal, its drain coupled to the thirteenth node and its gate coupled to the eleventh node. The fourth invertor amplifies the second receiver output. The thirteenth node is the second enhanced receiver's output.

In one embodiment of the present invention, the sixth, seventh, twelfth and thirteenth transistors are low threshold transistors.

In one embodiment of the present invention, any number of gates, sources and drains can be exchanged for bases, emitters and collectors such that the amplifier circuit includes or is entirely constructed with bipolar transistors.

In one embodiment of the present invention one input is tied to a fixed reference voltage.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

A fully differential, double-ended self-biased receiver is described. It provides particular advantages over the heretofore described single-ended self biasing amplifiers. In a preferred embodiment it is capable of swinging rail-to-rail. The circuit is fully complementary in that it has an equal number of n-type transistors and p-type transistors serving complementary circuit functions. The invention includes a novel method and apparatus for developing and utilizing a self bias voltage. The method frees an output otherwise used for developing the self bias voltage. The freed output is symmetrically configured for use as a second output. The second output signals are analogous but complementary to that of the original single-ended output. The resulting receiver becomes one with substantially equivalent dual-ended inputs and outputs.

A primary purpose of the receiver is to enable reception of two differential inputs and the generation of two generally analogous but complementary outputs. In a digital utilization, one output is in a first state with the other output in a second state, when a first input is in one voltage relation with respect to the second input. The outputs exchange states when the first input goes to an opposite voltage relation with respect to the second input. Preferably, in the first relationship the outputs are on opposite sides of the power supply rail, and in the second state the outputs exchange rail sides from that of the first state. The advantages of having a pair of fully symmetrical complementary outputs as compared to a single ended output is well known to those skilled in the art. These include advantages in regard to the skew between the true and complementary outputs, circuit area, power, input capacitance and speed.

For purposes of this application a transistor having only its drain, source, collector or emitter tied to only the drain, source, collector or emitter of another transistor is said to be coupled to, and in series with, that other transistor. Three or more transistors connected in series are said to form a transistor stack. A transistor is said to be coupled between two nodes if each of these nodes is connected to a different one of the transistor's drain, source, collector and emitter terminals. Unless otherwise indicated a transistor's input is its gate or base depending upon the transistor technology employed.

Figure 1:
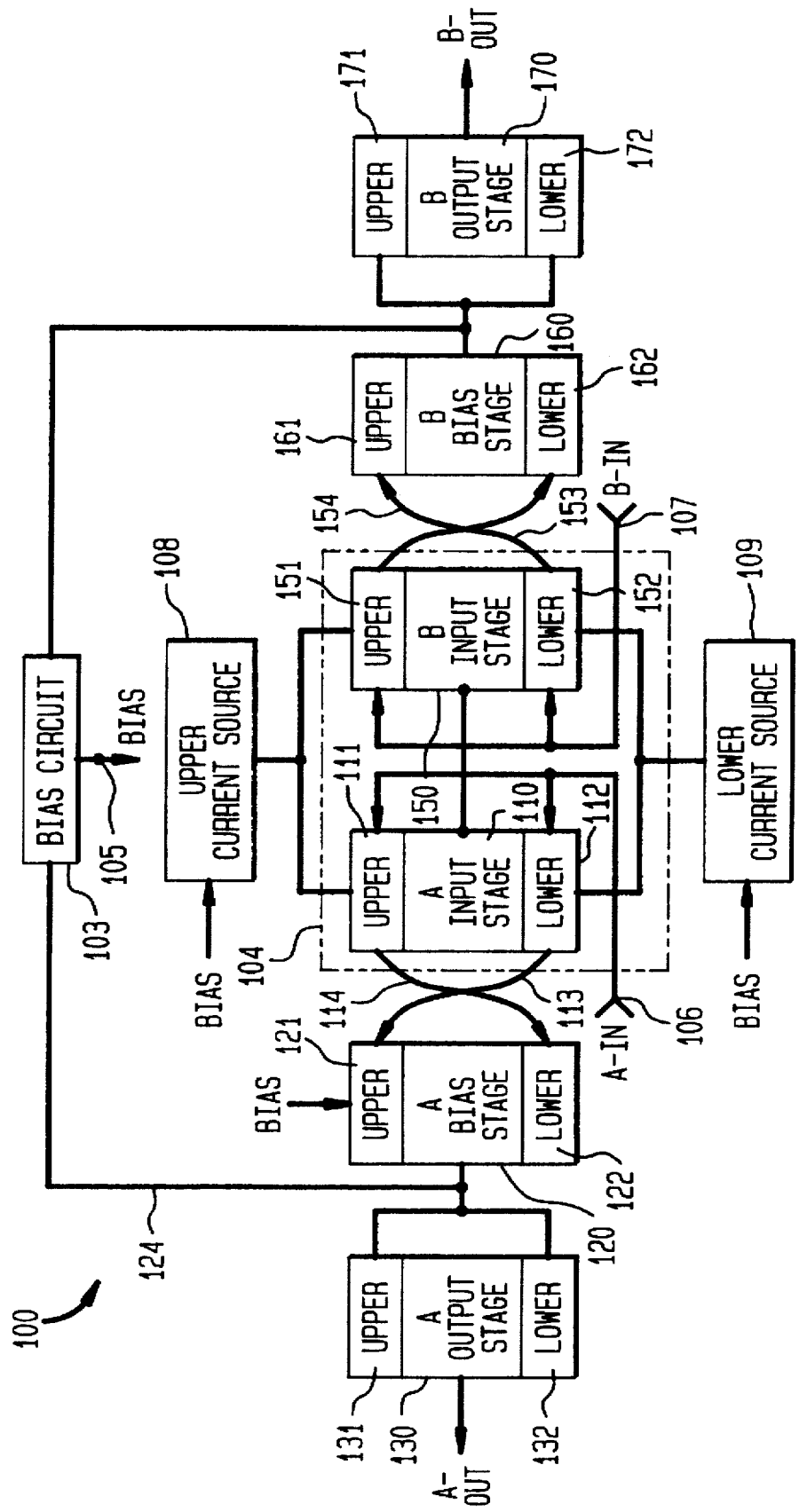
FIG. 1 shows a block diagram of a receiver of the present invention.

FIG. 1 shows a block diagram of a receiver of the present invention. As shown in FIG. 1, the receiver 100 is formed by three pairs of stages, a pair of input stages 110, 150, a pair of biasing stages 120, 160, and a pair of output stages 130, 170. One stage of each pair of stages is said to be on the receiver's A-side. The other stage of each pair is said to be on the receiver's B-side. Thus input stage 110, biasing stage 120, and output stage 130 are on the A-side, and input stage 150, biasing stage 160, and output stage 170 are on the B-side. When describing circuit couplings that are identically relevant to both the A-side and the B-side, the numeric symbols of the corresponding A-side item is followed immediately by the numeric symbols of the corresponding B-side item.

Each stage is formed in a dual arrangement of an upper portion and a complementary lower portion. In the case shown in FIG. 1, the upper portion is connected towards the higher voltage rail 101 and generally includes p-type transistors. The lower portion is connected towards the lower voltage rail 102 and generally includes n-type transistors. The portions are coupled together such that the lower portion has mirror symmetry with the upper portion. A circuit or stage so arranged is said to be fully complementary.

Each differential input, A-in 106 and B-in 107, is fed simultaneously to both the upper and lower portions of their respective input stage. Each input stage portion's output is cross coupled to the other portion's biasing stage input. Thus the output 113, 153 from the lower portion 112, 152 is coupled to the input of the biasing stage's upper portion 121,151. The outputs 124, 164 of each biasing stage are tied together and feed both the upper portion 131,171 and lower portion 132, 172 of its corresponding output stage.

The input stages are connected in a differential amplifier 104 configuration which receives the two differential inputs A-in 106 and B-in 107, and amplifies their difference signal. The differential amplifier is driven by an upper constant current source 108 and an upper constant current source 109. Each output 113, 153 of the input stages 110, 150 feeds a biasing stage 120, 160 from which the self bias signal 105 is developed. The self bias 105 signal is developed in bias circuit 103, and is preferably formed from a voltage divider connected between the two biasing stage outputs 124, 164. The voltage divider output is used to provide a bias 105 for the constant current sources and for the biasing stage 120, 160 transistors. Generally, each biasing stage 120, 160 is connected to an output stage 130, 170 which converts the current output of the biasing stage into a voltage output. In digital applications, the receiver 100 voltage outputs are usable as comparator output signals and desirably swing between the power supply rails.

With small signal inputs, the input and biasing stages operate in their linear regions. Thus both the input stages, as well as the biasing stages, produce output signals which are complementary and proportional to the difference between the two input signals. These outputs may be used for differential amplifier purposes without the receiver having an internal output stage. Whereas the input stage outputs 113, 114, 153, 154 may be regarded as voltage outputs, the biasing stage outputs 124, 164 are intrinsically best regarded as current outputs. The biasing stage outputs operate in complementary fashion. Depending on the relative amplitudes of the differential inputs, one biasing stage's load sinks the output current, while the other biasing stage's load sources the output current.

Figure 2:
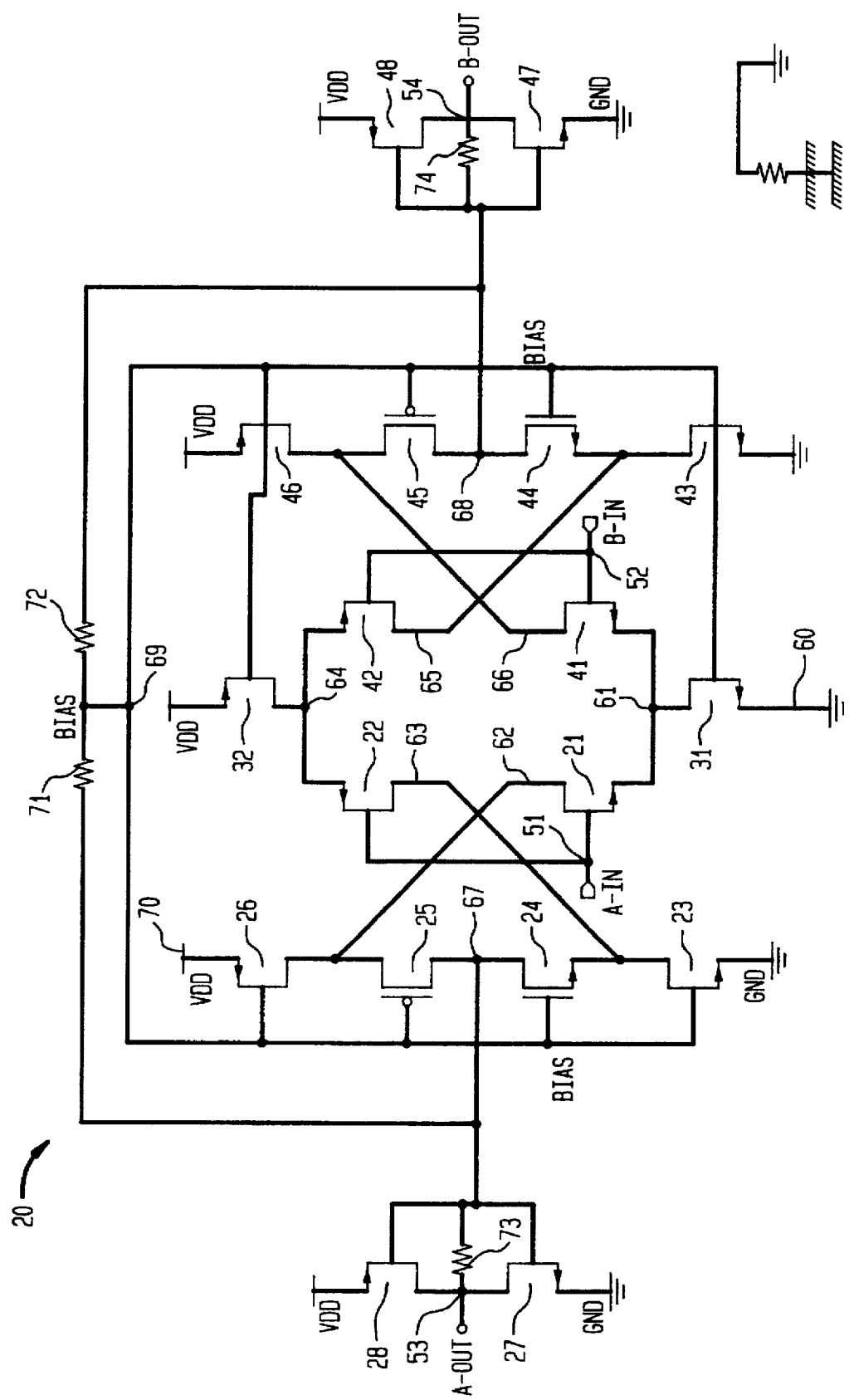
FIG. 2 shows a circuit schematic of a fully differential self-biased receiver in accordance with the present invention.

A circuit schematic diagram of an embodiment of a FDSR receiver 20 is shown in FIG. 2. The receiver 20 includes transistors 21–29, 31,32, 41–49 and resistors 71–74 coupled together as described below. The circuit as shown, is fully complementary in that it has an equal number of n-type transistors and p-type transistors serving complementary circuit functions. The purpose of the receiver 20 is to receive an A-input at node 51, a B-input at node 52, and produce an output at A-output, node 53, which is complementary to the output at B-output, node 54. Each output is in one of two states. A-output is in the first state with B-output in the second state, when A-input, node 51, is in one voltage relation with respect to B-input, node 52. A-output is in the second state with B-output in the first state when A-input, node 51, is in an opposite voltage relation with respect to B-input, node 52. Preferably, in the first input voltage relationship the outputs are substantially on opposite sides of the power supply rail, and in the second voltage relationship the outputs exchange rail sides from that of the first relationship.

The receiver is formed by three stages in a dual, complementary and symmetrical arrangement about nodes 61 and 64. The first of the dual sides, which contains A-input, node 51, is referred to as the A-side. The second of the dual sides, which contains B-input, node 52, is referred to as the B-side. Each side has three stages namely an input stage, a biasing stage and an output stage. The input stages and the biasing stages together form a fully differential amplifier circuit which may be used independently to drive a load. It can also be used as a differential amplifier circuit with complementary outputs. Although, the amplifier outputs do not swing rail-to-rail, the outputs would follow the relationship of one input relative to the other input.

The A-side input stage and B-side input stage share n-type transistor 31 and p-type transistor 32. Transistor 31 is a current source for the differential transistor pair formed by transistors 21 and 41. Transistor 32 is a current source for the differential transistor pair formed by transistors 22 and 42. The drain of transistor 31 is coupled to node 61, and its source is coupled to a first rail terminal, node 60, of the power supply. The drain of transistor 32 is coupled to node 64, and its source is coupled to a second rail terminal, node 70, of the power supply. Often, the first rail terminal, node 60, is ground and the second rail terminal, node 70, is a positive voltage. In some other cases, neither rail is ground, or the second rail terminal, node 60, is ground and the first rail terminal, node 70, is a negative voltage.

The A-side input stage includes of n-type transistor 21 and p-type transistor 22. A-input, node 51, feeds the gates of transistors 21 and 22. The source of transistor 21 is coupled to node 61. Its drain is coupled to node 62. The source of transistor 22 is coupled to node 64. Its drain is coupled to node 63.

The A-side biasing stage includes a transistor stack made-up of n-type transistors 23 and 24 and p-type transistors 25 and 26 coupled in series with each other. The source of transistor 23 is coupled to the first rail terminal, node 60. Its drain is coupled to the source of transistor 24 and to node 63. The source of transistor 26 is coupled to the second rail terminal, node 70. Its drain is coupled to the source of transistor 25 and to node 62. The drain of transistor 24 is coupled to the drain of transistor 25 and to node 67. This node 67 is a first amplifier output node.

The B-side stages are the dual of the A-side stages. Thus, the B-side input stage includes n-type transistor 41 and p-type transistor 42. A-input, node 51, feeds the gates of transistors 41 and 42. The source of transistor 41 is coupled to node 61. Its drain is coupled to node 62. The source of transistor 42 is coupled to node 64. Its drain is coupled to node 65

The B-side biasing stage includes a transistor stack made-up of n-type transistors 43 and 44 and p-type transistors 45 and 46 coupled in series with each other. The source of transistor 43 is coupled to the first rail terminal, node 60. Its drain is coupled to the source of transistor 44 and to node 63.

The source of transistor 46 is coupled to the second rail terminal, node 70. Its drain is coupled to the source of transistor 45 and to node 62. The drain of transistor 44 is coupled to the drain of transistor 45 and to node 68. This node 68 is a second amplifier output node.

The A-side biasing stage and the B-side biasing stage have two resistors 71 and 72 in common. The resistors are connected in series being tied together at node 69. The series combination is coupled 15 between node 67 of the A-side biasing stage and node 68 of the B-side biasing stage. Thus resistors 71 and 72 form a voltage divider of the voltage between nodes 67 and 68. Since resistors 71 and 72 have substantially the same resistance value, the voltage at node 69 is substantially midway between the voltages at nodes 67 and 68. Node 69 is thus established as a very much centralized bias voltage for biasing all the biasing stage transistors, 23-26 and 43-46, and the input stage rail-connected transistors 31 and 32. Thus node 69 is coupled to the gates of transistors 23-26, 31,32, and 43-46.

This novel self-biasing technique provides all of the advantages of the here to fore used self-biasing methods and more. It essentially frees up node 67 for use as an output which is complementary to the output at node 68, providing the present invention's desired differential complementary outputs. It provides the common mode feedback required by fully differential circuits but not required by single-ended circuits. Without the common mode feedback, the common mode output voltage goes to a power supply rail making it impossible to amplify differential inputs. Use of the two resistors voltage divider as the common mode feedback circuit is particularly possible in the receiver 20 circuit, because the output impedances of nodes 67 and 68 are not as high as in some other cascade stages. This allows loading these nodes with the two resistors without seriously affecting the output impedances. The value of resistance of these resistors depends upon the type and size of the transistors used and the rail-to-rail power supply voltage. When the power supply voltage is 3.3 VDC, a typical value of resistors 71 and 72 is 50K-ohm.

It is noted that the dual input and biasing stages together provide a complete differential amplifier function responding to the signal level at A-input, node 51, relative to the signal level at B-input, node 52. The differential amplifier outputs are nodes 67 and 68. The purpose of the output stage is to amplify and convert these amplifier current outputs into the more usually desired rail-to-rail voltage outputs.

The A-side output stage includes n-type transistor 27 and p-type transistor 28 and resistor 73, which together form a CMOS invertor. The source of transistor 27 is coupled to the first rail terminal, node 60. The source of transistor 28 is coupled to the second rail terminal, node 70. The drains of both transistors 27, 28 are coupled to the A-output, node 53. Resistor 73 is coupled between nodes 53 and 67. Resistor 73 provides the desired current to voltage conversion. It acts as either a current sourcing or current sinking device depending on the state of the signal at node 67. It sinks current when the voltage at node 67 is above the bias voltage at node 69, and it supplies current when the voltage at node 67 is below the bias voltage at node 69.

The B-side output stage includes n-type transistor 47 and p-type transistor 48 and resistor 74, which together form a CMOS invertor on the B-side. The source of transistor 47 is coupled to the first rail terminal, node 60. The source of transistor 48 is coupled to the second rail terminal, node 70. The drains of both transistors 47, 48 are coupled to the B-output, node 54. Resistor 74 is coupled between nodes 54 and 68. Resistor 74 provides the desired current to voltage conversion. It acts as either a current sourcing or current sinking device depending on the state of the signal at node 68. It sinks current when the voltage at node 68 is above the bias voltage at node 69, and it supplies current when the voltage at node 68 is below the bias voltage at node 69. When the power supply voltage is 3.3 VDC, a typical value of resistors 73 and 74 is 10K-ohm. The drains of the CMOS invertors are the true and complementary output nodes of the FDSR receiver 20.

The receiver 20 operates in the following manner. The average of the A-input voltage and B-input voltage is called the common input. When the common input is high, such that it is close to the second power supply rail, the two n-type transistors 21 and 41 are active and the p-type transistors 22 and 42 are off. When the common input voltage is low, such that it is close to the first power supply rail, the two p-type transistors 22 and 42 are active and the n-type transistors 21 and 41 are off. If the common input is substantially centered between the two rails all input transistors 21, 22, 41 and 42, are active. The input differential signal, which corresponds to the voltage difference between the A-input at node 51 and the B-input at node 52, drives the input transistors 21, 22, 41, and 42, and causes a current imbalance between the currents in the A-side biasing stage and the B-side biasing stage. The imbalance of currents in the biasing stages causes essentially equal but opposite polarity currents to flow through resistors 73 and 74 in the CMOS invertors. The required negative common mode feedback is established by biasing all the biasing stage transistors 23-26 and 43-46, and transistors 31 and 32, from the average of the voltage at nodes 67 and 68. The average of the voltage at nodes 67 and 68, obtained through the voltage divider formed by resistor 71 and 72, is referred to as the common output voltage. The biasing technique sets the biasing stage transistors activated to operate in their active region.

Figure 3:
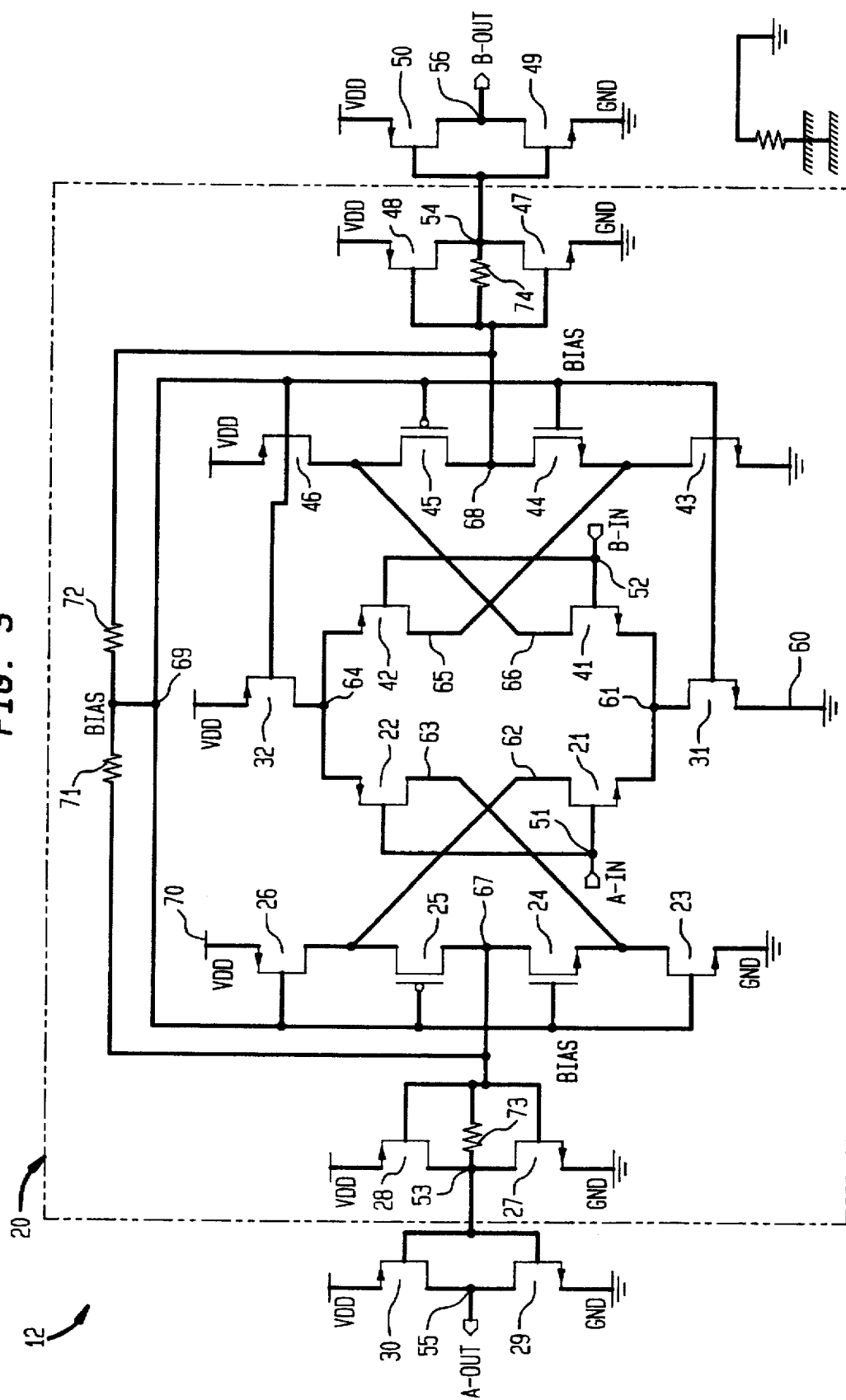
FIG. 3 shows a circuit schematic of an enhanced fully differential self-biased receiver in accordance with the present invention.

In cases wherein the invertor stages have sufficient gain, a large rail-to-rail output signal is generated at the invertor outputs, nodes 53 and 54. In other cases a second pair of complementary invertor circuits may be required to provide the full rail-to-rail output swing. An embodiment of an enhanced receiver 12 using a second pair of invertors is shown in FIG. 3. In this circuit, complementary A-side and B-side amplifiers are coupled to the outputs of receiver 20. On the A-side, the gates of n-type transistor 29 and p-type transistor 30 are coupled to node 53. The drains of both are coupled to node 55. This node 55 is the first enhanced receiver output of receiver 12. On the B-side, the gates of n-type transistor 49 and p-type transistor 50 are coupled to node 54. The drains of both are coupled to node 56. This node 56 is the second enhanced receiver output of receiver 12. In most cases, the circuit of enhanced receiver 12 may be used as a fully differential comparator circuit. In a few cases still another pair of invertors may be required to be certain that the output swings rail-to-rail.

Figure 4:
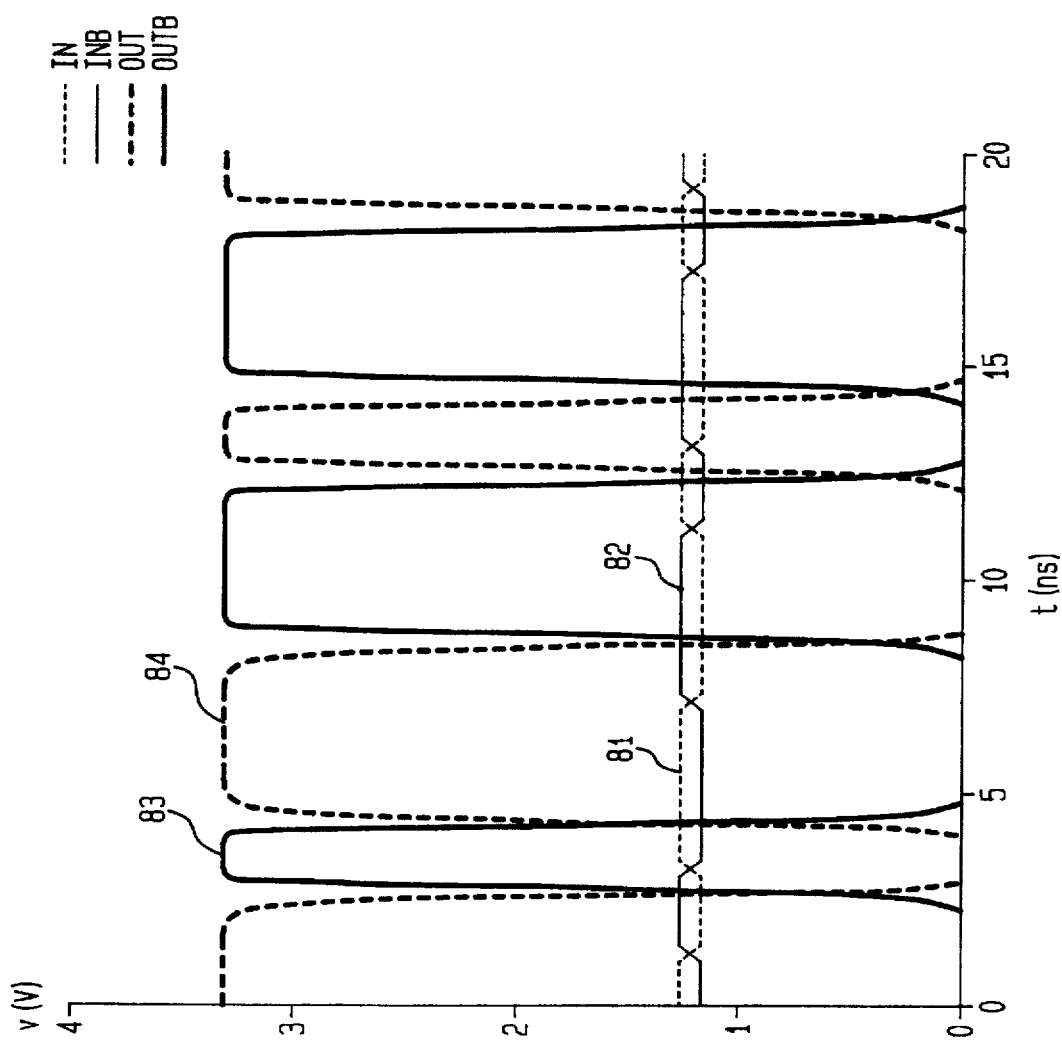
FIG. 4 shows a signal diagram of differential input signals and the resulting output of an FDSR in accordance with the present invention.

A particular receiver designed in accordance with the present invention, having the embodiment shown in FIG. 3, has the following circuit parameters. It is designed to utilize CMOS transistors and to operate with a +3.3 VDC power supply. The length and width of each transistor are given in Table 1. The first rail terminal, node 60, being ground and the second rail terminal, node 70, being +3.3 VDC. The feedback resistors 71, 72 have a resistance of 50k-ohms. The resistance of the first invertor resistors 73 and 74 is 10k-ohms. FIG. 4 shows a signal diagram for a receiver having a first low level input 81 and a second low level input 82. Both a first enhanced receiver output 83 and a second enhanced receiver output 84 swing substantially rail-to-rail. Each output swings approximately between zero volts and +3.3 volts.

As indicated in Table 1, it is desirable for the components on the A-side to be matched to the corresponding components on the B-side so as to enhance the circuit's performance. It is also advantageous and desirable that transistors 24, 25, 44 and 45 be of a type having a low gate-to-source threshold voltage. All the others can be of a type having a high gate-to-source threshold voltage. This is shown in FIGS. 2 and 3, in which the circuit representation of the gates of transistors 24, 25, 44 and 45 are different than the representation of the other circuit transistors. It is also indicated in Table 1, by showing these transistors to have a wider width than the other transistors.

Among the advantages of self-biasing are a more compact layout, a more robust circuit and improved matching between the transistor threshold voltages. This is a result of self-biasing since the biasing

TABLE 1

| TRANSISTOR SIZES | | | |
|---|---|---|---|
| TRANSISTOR DESIGNATION | TYPE | LENGTH MICRONS | WIDTH MICRONS |
| 21, 41 | N | 20 | .8 |
| 22, 42 | P | 60 | .8 |
| 23, 43 | N | 6 | .8 |
| 24, 44 | N | 14 | 2 |
| 25, 45 | P | 25 | 2 |
| 26, 46 | P | 15 | .8 |
| 27, 47 | N | 10 | .8 |
| 28, 48 | P | 28 | .8 |
| 29, 49 | N | 10 | .8 |
| 30, 50 | P | 28 | .8 |
| 31 | N | 9 | .8 |
| 32 | P | 18 | .8 | circuit is local to the transistors being biased, rather than at a long distance across the chip away from the transistors being biased.

Figure 5:
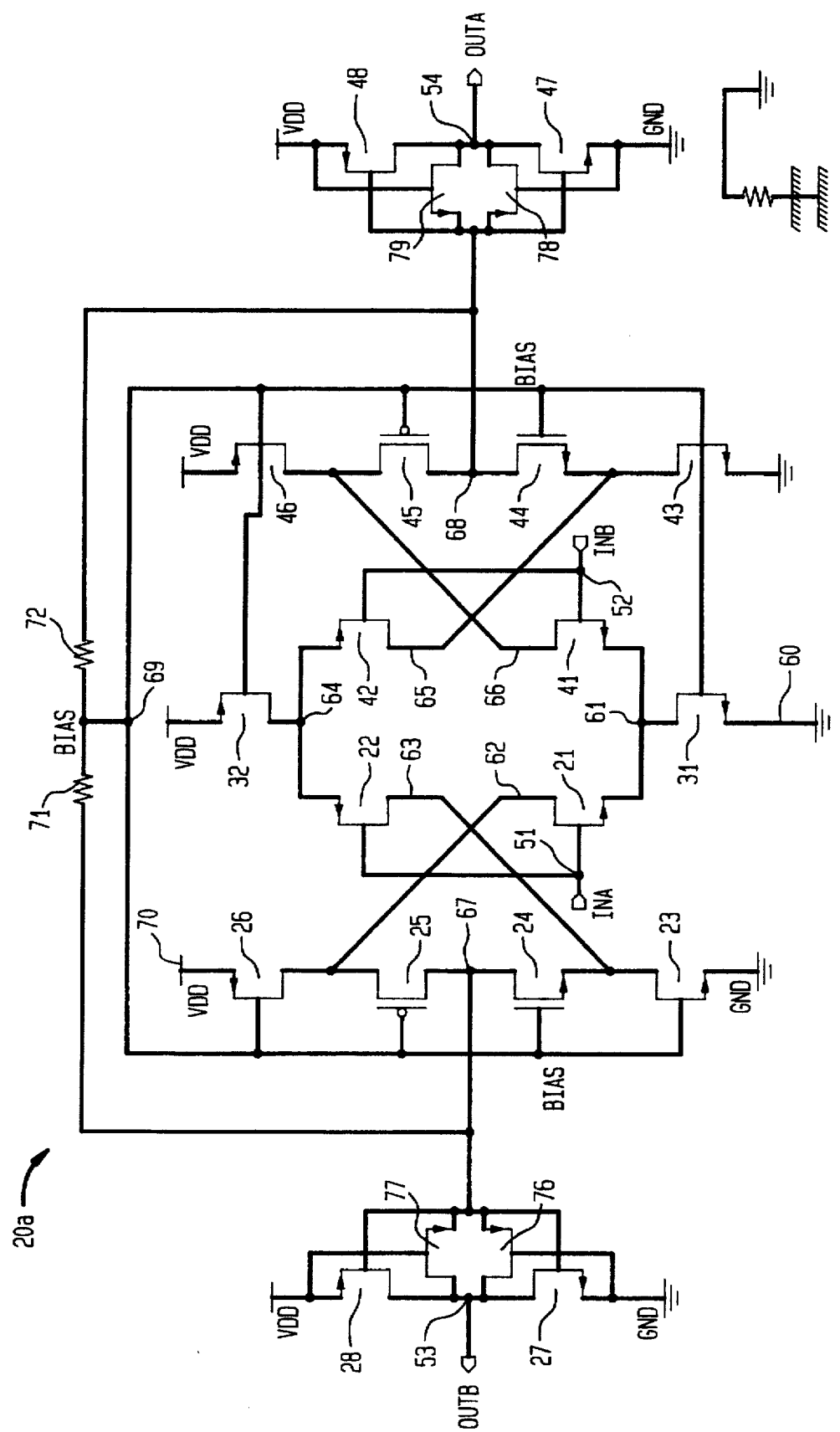
FIG. 5 shows a circuit schematic for using transistors for the resistors in the output stages of the present invention.

There are many alternative embodiments of the present invention. For example in FIG. 2, each invertor resistor 73, 74 may be replaced by a pair of transistors consisting of an n-type and a p-type transistor. This is shown in embodiment 20a of FIG. 5, in which transistors 76 and 77 replace resistor 73 on the A-side, and transistors 78 and 79 replace resistor 74 on the B-side. In the embodiment shown, transistors 77 and 79 are n-type transistors, and transistors 76 and 78 are p-type transistors. All four transistors are wired as variable FET resistors. The gates of transistors 76 and 78 are coupled to the first rail. The gates of transistors 77 and 79 are coupled to the second rail. The drains of transistors 76 and 77 are coupled to node 53. Their sources are coupled to node 67. The drains of transistors 78 and 79 are coupled to node 54. Their sources are coupled to node 68.

Figure 6:
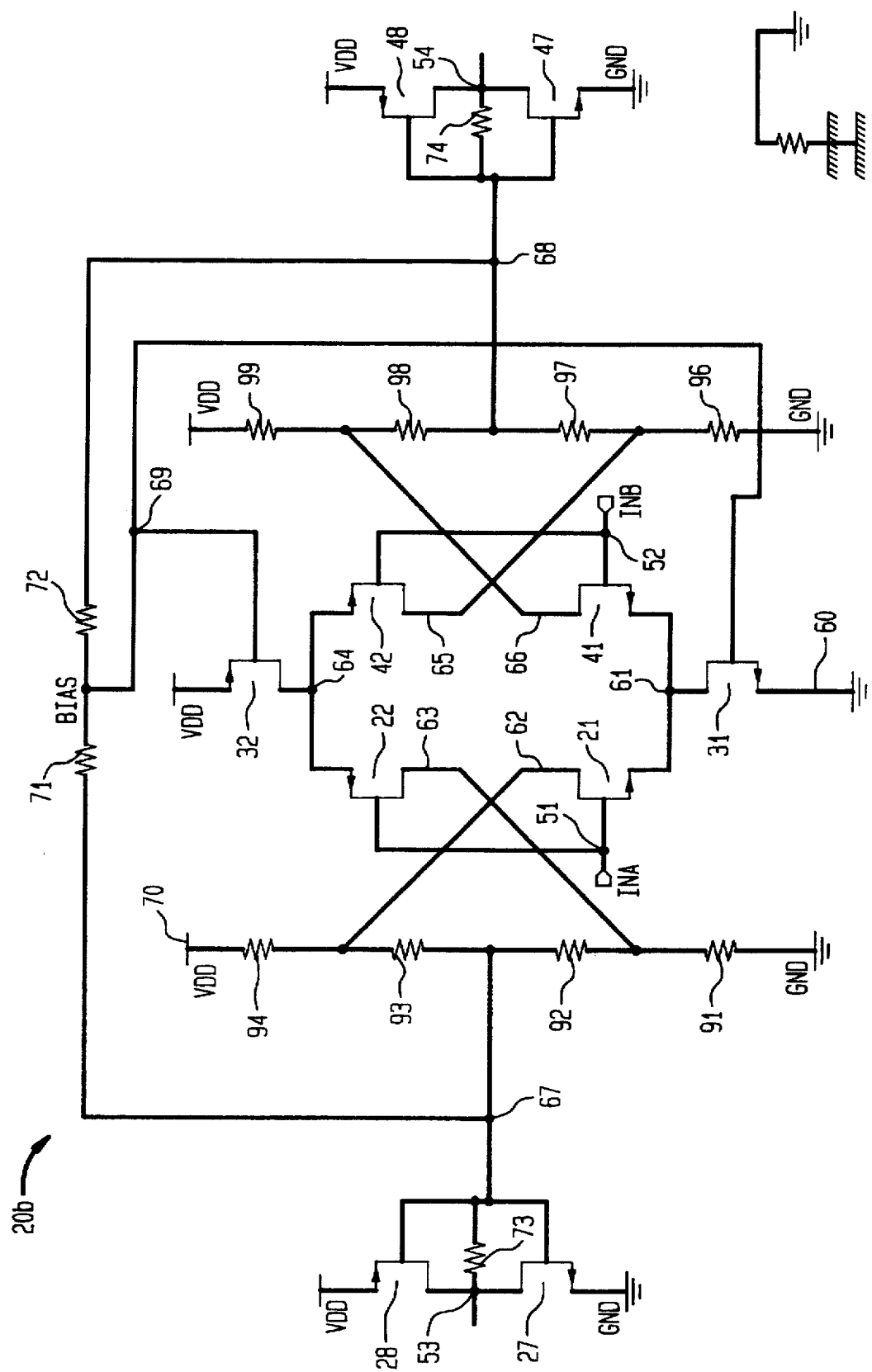
FIG. 6 shows a circuit schematic for using resistors for the biasing stage of the present invention.

Referring to FIG. 2, the biasing stages provides high to low impedance transformation and provide a means to obtain a combined output from the input stage's upper 111,151 and lower portions 112, 152. This combined output is the common mode voltage used for biasing. Although it is preferred that each portion of the biasing stage be formed using a pair of transistors in series, it may alternatively be formed by passive components such as resistors and/or transformers. A resistor configuration is shown in FIG. 6. In FIG. 6, on the A-side, resistors 91–94 are in series and coupled between the power rails. The junction of resistors 91 and 92 is coupled to node 63. The junction of resistors 93 and 94 is coupled to node 62. The junction of resistors 92 is 93 are coupled to form node 67. Resistors 95–98 are in series and coupled between the power rails. The junction of resistors 91 and 92 is coupled to node 63. The junction of resistors 93 and 94 is coupled to node 62. The junction of resistors 92 is 93 are coupled to form node 67. Still another alternative configuration of the biasing circuit would use transistors to replace the resistors in the voltage divider circuit.

Notwithstanding the receiver being described as a device operating on the differential between two input signals, it is also useful as a single input comparator. This is achieved by coupling one of the inputs to a fixed reference voltage. In this case the outputs would be dependent upon the relationship between the signal on the second input and the reference voltage.

Although the description is made for a particular circuit arrangement using CMOS FET transistors in a specific connection, the intent and concept of the present invention are suitable and applicable to other transistor technologies, circuit and power supply arrangements. For example, the circuit can be configured in low and high power applications using bipolar transistors or a mixture of bipolar and FET components. The method and circuit can be employed with circuits that are not fully complementary, and/or are not symmetrical, and/or do not have complementary outputs. The voltage divider may be formed using transistors. Those skilled in the art can reconfigure the circuit to use negative and/or positive power rails. The n-type and p-type transistors can be interchanged with an exchange of drains with sources, or emitters with collectors, and so on. Also, extra CMOS invertors can be added to the output of the receiver to make sure that the final output signals swing rail-to-rail. It will be clear to those skilled in the art that other modifications to the disclosed embodiments can be effected without departing from the spirit and scope of the invention.

What is claimed is:

1. An amplifier circuit comprising:

a first transistor having a source coupled to a first voltage terminal, a drain coupled to a first node and a gate coupled to a biasing node;

a second transistor having a source coupled to a second voltage terminal and a drain coupled to a second node and a gate coupled to said biasing node;

a third transistor having a source coupled to said first node and a drain coupled to a third node and a gate coupled to accept a first input signal;

a fourth transistor having a source coupled to said second node, a drain coupled to a fourth node and a gate coupled to accept said first input signal;

a fifth transistor having a source coupled to said first voltage terminal, a drain coupled to said fourth node and a gate coupled to said biasing node;

a sixth transistor having a source coupled to said fourth node and a drain coupled to a fifth node and a gate coupled to said biasing node, said fifth node being a first amplifier output having a first signal output proportional to the difference between said first input signal and second input signal;

a seventh transistor having a source coupled to said third node, a drain coupled to said fifth node and a gate coupled to said biasing node;

an eighth transistor having a source coupled to said second voltage terminal, a drain coupled to said third node and a gate coupled to said biasing node;

a ninth transistor having a source coupled to said first node, a drain coupled to a sixth node and a gate coupled to accept a second input signal;

a tenth transistor having a source coupled to said second node, a drain coupled to a seventh node and a gate coupled to accept said second input signal;

an eleventh transistor having a source coupled to said first voltage terminal and a drain coupled to said seventh node and a gate coupled to said biasing node;

a twelfth transistor having a source coupled to said seventh node, a drain coupled to an eighth node and a gate coupled to said biasing node, said eighth node being a second amplifier output having a second signal output proportional to the difference between said first input signal and second input signal and being complementary to said first amplifier output;

a thirteenth transistor having a source coupled to said sixth node, a drain coupled to said eighth node and a gate coupled to said biasing node;

a fourteenth transistor having a source coupled to said second voltage terminal and a drain coupled to said sixth node and a gate coupled to said biasing node;

a first resistor coupled between said fifth node and said biasing node;

a second resistor coupled between said eighth node and said biasing node, said first and second resistors forming a negative bias feedback circuit feeding said biasing node.

2. The amplifier as in claim 1 wherein the resistance of said first resistor is substantially equal to the resistance of said second resistor.

3. The amplifier as in claim 1 wherein said first voltage terminal is at ground potential at zero volts.

4. The amplifier as in claim 1 wherein said first, third, fifth, sixth, ninth, eleventh and twelfth transistors are n-type CMOS transistors and second, fourth, seventh, eighth, tenth, thirteenth and fourteenth transistors are p-type CMOS transistors.

5. The amplifier as in claim 1 wherein said sixth, seventh, twelfth and thirteenth transistors are low threshold transistors.

6. The amplifier as in claim 1 further including
a first invertor comprising:
a fifteenth transistor having a source coupled to said first voltage terminal, a drain coupled to a tenth node and a gate coupled to said fifth node;
a sixteenth transistor having a source coupled to said second voltage terminal, a drain coupled to a tenth node and a gate coupled to said fifth node; and
a third resistor coupled between said fifth node and said tenth node;
said tenth node being a first invertor output, said first invertor converting current from said first amplifier output into a voltage signal; and
a second invertor comprising:
a seventeenth transistor having a source coupled to said first voltage terminal, a drain coupled to an eleventh node and a gate coupled to said eighth node;
an eighteenth transistor having a source coupled to said second voltage terminal, a drain coupled to said eleventh node and a gate coupled to said eighth node;
a fourth resistor coupled between said eighth node and said eleventh node;
said eleventh node being a second receiver output, said second invertor converting current from said second amplifier output into a voltage signal.

7. The amplifier as in claim 6 further including:
a third invertor comprising:
a nineteenth transistor having a source coupled to said first voltage terminal, a drain coupled to a twelfth node and a gate coupled to said tenth node;

a twentieth transistor having a source coupled to said second voltage terminal, a drain coupled to said twelfth node and a gate coupled to said tenth node;

said third invertor amplifying said first receiver output, said twelfth node being a first enhanced receiver output;

a fourth invertor comprising:
a twenty-first transistor having a source coupled to said first voltage terminal, a drain coupled to a thirteenth node and a gate coupled to said eleventh node;
a twenty-second transistor having a source coupled to said second voltage terminal, a drain coupled to said thirteenth node and a gate coupled to said eleventh node;
said fourth invertor amplifying said second receiver output, said thirteenth node being a second enhanced receiver output.

8. The amplifier as in claim 7 wherein said fifteenth, seventeenth, nineteenth and twenty-first transistors are n-type transistors and said sixteenth, eighteenth, twentieth and twenty-second transistors are p-type transistors.

9. The circuit as in claim 1 wherein said first input signal is a fixed reference voltage.

10. An amplifier circuit comprising:
a first transistor coupled between a first voltage terminal and a first node, and having an input coupled to a biasing node;
a second transistor coupled between a second voltage terminal and a second node, and having an input coupled to said biasing node;
a third transistor coupled between said first node and a third node, and having an input coupled to accept a first input signal;
a fourth transistor coupled between said second node and a fourth node, and having an input coupled to accept said first input signal;
a fifth transistor coupled between said first voltage terminal and said fourth node, and having an input coupled to said biasing node;
a sixth transistor coupled between said fourth node and a fifth node, and having an input coupled to said biasing node, said fifth node being a first amplifier output having a first signal output proportional to the difference between said first input signal and second input signal;
a seventh transistor coupled between said third node and said fifth node, and having an input coupled to said biasing node;
an eighth transistor coupled between said second voltage terminal and said third node, and having an input coupled to said biasing node;
a ninth transistor coupled between said first node and a sixth node, and having an input coupled to accept a second input signal;
a tenth transistor coupled between said second node and a seventh node, and having an input coupled to accept said second input signal;
an eleventh transistor coupled between said first voltage terminal and said seventh node, and having an input coupled to said biasing node;
a twelfth transistor coupled between said seventh node and an eighth node, and having an input coupled to said biasing node, said eighth node being a second amplifier output having a second signal output proportionate to the difference between said first input signal and second input signal, and being complementary to said first amplifier output;

a thirteenth transistor coupled between said sixth node and said eighth node, and having an input coupled to said biasing node;

a fourteenth transistor coupled between said second voltage terminal and said sixth node, and having an input coupled to said biasing node;

a first resistor coupled between said fifth node and said biasing node;

a second resistor coupled between said eighth node and said biasing node, said first and second resistors forming a negative bias feedback circuit feeding said biasing node.

11. The amplifier as in claim 10 wherein the resistance of said first resistor is substantially equal to the resistance of said second resistor.

12. The amplifier as in claim 10 wherein the transistors are bipolar devices having a base, emitter and collector, and wherein each said input is the base.

13. The amplifier as in claim 10 wherein said first voltage terminal is at ground potential at zero volts.

14. The amplifier as in claim 10 wherein said first, third, fifth, sixth, ninth, eleventh and twelfth transistors are n-type CMOS transistors and said second, fourth, seventh, eighth, tenth, thirteenth and fourteenth transistors are p-type CMOS transistors, and wherein each said input is a gate.

15. The amplifier as in claim 10 wherein said sixth, seventh, twelfth and thirteenth transistors are low threshold transistors.

16. The amplifier as in claim 10, wherein at least one of said transistors has an emitter and a collector.

17. The amplifier as in claim 10 further including a first invertor comprising:

a fifteenth transistor coupled between said first voltage terminal and a tenth node, and having an input coupled to said fifth node;

a sixteenth transistor coupled between said second voltage terminal and said tenth node, and having an input coupled to said fifth node; and a third resistor coupled between said fifth node and said tenth node;

said tenth node being a first invertor output, said first invertor converting current from said first amplifier output into a voltage signal; and a second invertor comprising:

a seventeenth transistor coupled between said first voltage terminal and an eleventh node, and having an input coupled to said eighth node;

an eighteenth transistor coupled between said second voltage terminal and said eleventh node, and having an input coupled to said eighth node;

a fourth resistor coupled between said eighth node and said eleventh node;

said eleventh node being a second receiver output, said second invertor converting current from said second amplifier output into a voltage signal.

18. The amplifier as in claim 17 further including:

a third invertor comprising:

a nineteenth transistor coupled between said first voltage terminal and a twelfth node and an input coupled to said tenth node;

a twentieth transistor coupled between said second voltage terminal and said twelfth node and an input coupled to said tenth node;

said third invertor amplifying said first receiver output, said twelfth node being a first enhanced receiver output;

a fourth invertor comprising:

a twenty-first transistor coupled between said first voltage terminal and a thirteenth node and an input coupled to said eleventh node;

a twenty-second transistor coupled between said second voltage terminal and said thirteenth node and an input coupled to said eleventh node;

said fourth invertor amplifying said second receiver output, said thirteenth node being a second enhanced receiver output.

19. The amplifier as in claim 18 wherein said fifteenth, seventeenth, nineteenth and twenty-first transistors are n-type transistors, and said sixteenth, eighteenth, twentieth and twenty-second transistors are p-type transistors.

20. An amplifier having means to accept a power source comprising:

a first differential input stage having a first input for accepting a first input signal and having a first input stage output;

a second differential input stage having a second input for accepting a second input signal and having a second input stage output;

each of said first and second input stages being formed in a dual manner having a lower input portion coupled to an upper input portion, said lower input portion including a first connection of at least one n-type transistor, said upper input portion including a second connection of at least one p-type transistor, said second connection being connected in a mirror image of said first connection;

a first current source feeding said lower portion of each of said first and second input stages and having a first current source control input coupled to a bias;

a second current source feeding said upper portion of each of said first and second input stages and having a second current source control input coupled to said bias;

a first biasing stage coupled to said first input stage output and having a first biasing stage output and a first biasing stage control input coupled to said bias;

a second biasing stage coupled to said second input stage output and having a second biasing stage output and a second biasing stage control input coupled to said bias;

each of said first and second biasing stages being formed in a dual manner and having a lower input portion coupled to an upper input portion, said lower input portion including a third connection of at least one n-type transistor, said upper input portion including a fourth connection of at least one p-type transistor, said forth connection being connected in a mirror image of said third connection;

a voltage divider coupled between said first biasing stage output and said second biasing stage output to generate said bias, said bias being a negative feedback signal for biasing said control inputs;

a first output stage coupled to said first biasing stage output and having a first amplifier output;

a second output stage coupled to said second input stage and having a second amplifier output;

each of said first and second output stages being formed in a dual manner having a lower output portion coupled to an upper output portion, said lower output portion including a fifth connection of at least one n-type transistor, said upper output portion including a sixth connection of at least one p-type transistor, said sixth connection being connected in a mirror image of said fifth connection;

said input, biasing and output stages and current sources all being energized by said power source.

21. A receiver circuit having a means to accept a power source and comprising:

a complementary differential amplifier having a first amplifier input for accepting a first input signal, a second amplifier input for accepting a second input signal, a first amplifier pair of outputs, and a second amplifier pair of outputs;

a complementary current source feedings said amplifier, said current source having a pair of current source inputs, each current source input coupled to a bias output;

a complementary first biasing stage cross-coupled to said first amplifier pair of outputs, and having a first biasing stage input coupled to said bias output, and a first biasing stage output;

a complementary second biasing stage cross-coupled to said second amplifier pair of outputs, and having a second biasing stage input coupled to said bias output, and a second biasing output;

a bias circuit means coupled between said first biasing output and said second biasing output, said bias circuit producing said bias output, said bias output being a source of negative feedback;

a complementary first output stage coupled to said first biasing output and having a first output stage output, said first output stage output producing a first signal voltage dependent upon the relation between said first input voltage and said second input voltage;

a complementary second output stage coupled to said second biasing output and having a second output stage output, said second output stage output producing a second signal voltage dependent upon the relation between said first input voltage and said second input voltage and being complementary to said first output stage output.

22. The amplifier as in claim 21 wherein said bias circuit means includes a voltage divider comprising a first and second resistor connected in series coupled between said first biasing output and said second biasing output, and wherein a resistance of said first resistor is substantially equal to a resistance of said second resistor.

23. The amplifier as in claim 21 wherein at least one of said biasing stages includes a pair of n-type transistors and a pair of p-type transistors and wherein all said transistors are connected in series.

24. The amplifier as in claim 23 wherein said transistors are CMOS transistors.

25. The amplifier as in claim 21 wherein said power source has a voltage terminal at ground potential.

26. The amplifier as in claim 21 wherein said first signal voltage is substantially at a first rail voltage of said power source and said second signal voltage is substantially at a second rail voltage of said power source.

27. The amplifier as in claim 21 wherein:

said first biasing stage includes a first group of four resistors in series coupled between a pair of rails of said power source wherein:

a junction between a first and a second resistor, and a junction between a third and a fourth resistor, form said pair of first biasing nodes; and a junction between said second and said third resistor forms said first biasing stage output;

and said second biasing stage includes a second group of four resistors in series coupled between a pair of rails of said power source wherein:

a junction between a fifth and a sixth resistor, and a junction between a seventh and an eighth resistor, form said pair of second biasing nodes; and a junction between said sixth and said seventh resistor forms said second biasing stage output.

28. A method for producing and using a self-bias voltage to bias at least one bias-input of a local circuit, said circuit having a pair of biasing stages, each of said biasing stages having a biasing output, said method comprising the steps of:

coupling a bias circuit between said biasing outputs, said bias circuit producing said self-bias voltage; and coupling said self-bias voltage to said at least one bias-input;

and wherein said local circuit having complementary outputs.

29. A method for producing and using a self-bias voltage to bias at least one bias-input of a local circuit, said circuit having a pair of biasing stages, each of said biasing stages having a biasing output, said method comprising the steps of:

coupling a voltage divider between said biasing outputs, providing said divider with a divider output, said divider output producing said bias voltage; and coupling said self bias voltage to said at least one bias-input.

30. The method of claim 29 wherein said voltage divider is comprised of a first and second resistor connected in series, a junction between said first and second resistor being said divider output.

31. A device for producing and using a self-bias voltage to at least one bias input of a local circuit, said device comprising:

a pair of biasing stages, each of said biasing stages having a biasing output, a bias circuit coupled between said biasing outputs, said bias circuit producing said self-bias voltage; and means for coupling said self-bias voltage to said at least one bias input;

and wherein said device having complementary outputs.

32. A circuit for producing and using a self-bias voltage to bias at least one bias-input of a local complementary circuit, said device comprising:

a pair of biasing stages, each of said biasing stages having a biasing output; and a bias circuit coupled between said biasing outputs, and wherein said bias circuit includes a voltage divider having a divider output producing said bias voltage.

33. The circuit as in claim 32 wherein said voltage divider comprises a first and second resistor connected in series, a junction between said first and second resistor being said divider output.

34. An amplifier circuit comprising:

a first transistor having a drain coupled to a first voltage terminal, a source coupled to a first node and a gate coupled to a biasing node;

a second transistor having a drain coupled to a second voltage terminal and a source coupled to a second node and a gate coupled to said biasing node;

a third transistor having a drain coupled to said first node and a source coupled to a third node and a gate coupled to accept a first input signal;

a fourth transistor having a drain coupled to said second node, a source coupled to a fourth node and a gate coupled to accept said first input signal;

a fifth transistor having a drain coupled to said first voltage terminal, a source coupled to said fourth node and a gate coupled to said biasing node;

a sixth transistor having a drain coupled to said fourth node and a source coupled to a fifth node and a gate coupled to said biasing node, said fifth node being a first amplifier output having a first signal output proportional to the difference between said first input signal and second input signal;

a seventh transistor having a drain coupled to said third node, a source coupled to said fifth node and a gate coupled to said biasing node;

an eighth transistor having a drain coupled to said second voltage terminal, a source coupled to said third node and a gate coupled to said biasing node;

a ninth transistor having a drain coupled to said first node, a source coupled to a sixth node and a gate coupled to accept a second input signal;

a tenth transistor having a drain coupled to said second node, a source coupled to a seventh node and a gate coupled to accept said second input signal;

an eleventh transistor having a drain coupled to said first voltage terminal and a source coupled to said seventh node and a gate coupled to said biasing node;

a twelfth transistor having a drain coupled to said seventh node, a source coupled to an eighth node and a gate coupled to said biasing node, said eighth node being a second amplifier output having a second signal output proportional to the difference between said first input signal and second input signal and being complementary to said first amplifier output;

a thirteenth transistor having a drain coupled to said sixth node, a source coupled to said eighth node and a gate coupled to said biasing node;

a fourteenth transistor having a drain coupled to said second voltage terminal and a source coupled to said sixth node and a gate coupled to said biasing node;

a first resistor coupled between said fifth node and said biasing node;

a second resistor coupled between said eighth node and said biasing node, said first and second resistors forming a negative bias feedback circuit feeding said biasing node.

35. An amplifier circuit comprising:

a first transistor having an emitter coupled to a first voltage terminal, a collector coupled to a first node and a base coupled to a biasing node;

a second transistor having an emitter coupled to a second voltage terminal and a collector coupled to a second node and a base coupled to said biasing node;

a third transistor having an emitter coupled to said first node and a collector coupled to a third node and a base coupled to accept a first input signal;

a fourth transistor having an emitter coupled to said second node, a collector coupled to a fourth node and a base coupled to accept said first input signal;

a fifth transistor having an emitter coupled to said first voltage terminal, a collector coupled to said fourth node and a base coupled to said biasing node;

a sixth transistor having an emitter coupled to said fourth node and a collector coupled to a fifth node and a base coupled to said biasing node, said fifth node being a first amplifier output having a first signal output proportional to the difference between said first input signal and second input signal;

a seventh transistor having an emitter coupled to said third node, a collector coupled to said fifth node and a base coupled to said biasing node;

an eighth transistor having an emitter coupled to said second voltage terminal, a collector coupled to said third node and a base coupled to said biasing node;

a ninth transistor having an emitter coupled to said first node, a collector coupled to a sixth node and a base coupled to accept a second input signal;

a tenth transistor having an emitter coupled to said second node, a collector coupled to a seventh node and a base coupled to accept said second input signal;

an eleventh transistor having an emitter coupled to said first voltage terminal and a collector coupled to said seventh node and a base coupled to said biasing node;

a twelfth transistor having an emitter coupled to said seventh node, a collector coupled to an eighth node and a base coupled to said biasing node, said eighth node being a second amplifier output having a second signal output proportional to the difference between said first input signal and second input signal and being complementary to said first amplifier output;

a thirteenth transistor having an emitter coupled to said sixth node, a collector coupled to said eighth node and a base coupled to said biasing node;

a fourteenth transistor having an emitter coupled to said second voltage terminal and a collector coupled to said sixth node and a base coupled to said biasing node;

a first resistor coupled between said fifth node and said biasing node;

a second resistor coupled between said eighth node and said biasing node, said first and second resistors forming a negative bias feedback circuit feeding said biasing node.

* * * * *